(12) United States Patent
Yang et al.

(10) Patent No.: US 9,331,278 B2
(45) Date of Patent: May 3, 2016

(54) FORMING MEMRISTORS ON IMAGING DEVICES

(71) Applicant: Hewlett-Packard Development Company, L.P., Houston, TX (US)

(72) Inventors: Jianhua Yang, Palo Alto, CA (US); Ning Ge, Palo Alto, CA (US); Zhiyong Li, Palo Alto, CA (US); Minxian Max Zhang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 93 days.

(21) Appl. No.: 14/169,375

(22) Filed: Jan. 31, 2014

(65) Prior Publication Data
US 2015/0114927 A1    Apr. 30, 2015

Related U.S. Application Data (63) Continuation-in-part of application No. PCT/US2013/067872, filed on Oct. 31, 2013.

(51) Int. Cl.
| | |
|---|---|
| H01L 21/02 | (2006.01) |
| H01L 45/00 | (2006.01) |
| B41J 2/16 | (2006.01) |
| H01L 27/24 | (2006.01) |
| B41J 2/14 | (2006.01) |

(52) U.S. Cl.
CPC ......... *H01L 45/1633* (2013.01); *B41J 2/14129* (2013.01); *B41J 2/1601* (2013.01); *B41J 2/1607* (2013.01); *B41J 2/1626* (2013.01); *B41J 2/1631* (2013.01); *H01L 21/02565* (2013.01); *H01L 27/2463* (2013.01); *H01L 45/00* (2013.01); *H01L 45/04* (2013.01); *H01L 45/08* (2013.01); *H01L 45/145* (2013.01); *H01L 45/146* (2013.01); *H01L 45/147* (2013.01); *H01L 45/1675* (2013.01); *B41J 2202/13* (2013.01)

(58) Field of Classification Search
None
See application file for complete search history.

(56) References Cited

U.S. PATENT DOCUMENTS

| | | | |
|---|---|---|---|
| 6,502,240 | B1 | 12/2002 | Naclerio |
| 6,685,292 | B2 | 2/2004 | Oshima |
| 6,789,865 | B2 | 9/2004 | Suzuki et al. |
| 7,278,703 | B2 | 10/2007 | Benjamin et al. |
| 2003/0038127 | A1* | 2/2003 | Liu et al. .................. 219/390 |
| 2005/0099458 | A1* | 5/2005 | Edelen et al. ............. 347/54 |
| 2008/0090337 | A1* | 4/2008 | Williams .................. 438/133 |
| 2011/0038196 | A1* | 2/2011 | Tour et al. ................ 365/148 |
| 2013/0155766 | A1 | 6/2013 | Liu |

FOREIGN PATENT DOCUMENTS

WO    WO2011133138    * 10/2011 ............ H01L 21/332

OTHER PUBLICATIONS

H. Xiao, "Introduction to Semiconductor Manufacturing Technology, 2nd ed." SPIE Press, Bellingham, 2012, pp. 581-593.*
S. Wolf and R.N. Tauber, "Silicon Processing for the VLSI Era", vol. 1, Lattice Press, year 2000, pp. 822-825.*

(Continued)

*Primary Examiner* — Jiong-Ping Lu
(74) *Attorney, Agent, or Firm* — Brooks, Cameron & Huebsch, PLLC (57) ABSTRACT

Forming memristors on imaging devices can include forming a printhead body comprising a first conductive material, forming a memory on the printhead body by performing an oxidation process to form a switching oxide material on the first conductive material, and forming a second conductive material on the switching oxide material.

15 Claims, 7 Drawing Sheets

(56) References Cited

OTHER PUBLICATIONS

Blaise Mouttet, Proposals for Memristor Crossbar Design and Applications, Memristors and Memristive Systems Symposium UC Berkeley, Nov. 21, 2008, 59 pages.

Hewlett-Packard Development Company, L.P., Printheads Having Memories Formed Thereon, PCT Application No. PCT/US2013/087872, Filed on Oct. 31, 2013, 29 pages.

* cited by examiner

FORMING MEMRISTORS ON IMAGING DEVICES

PRIORITY APPLICATION INFORMATION

This is a continuation-in-part application of International Application Number PCT/US2013/067872 filed Oct. 31, 2013, the contents of which are incorporated herein by reference.

BACKGROUND

Imaging devices can include printers having printheads capable of depositing ink on a substrate such as paper. Imaging devices can further include components to store data.

DETAILED DESCRIPTION

Imaging devices can include memory. As used herein, imaging devices can include printheads (e.g., disposable integrated printheads (IPH) and/or permanent printheads with off-axis ink supplies), printers, and/or copiers. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

EPROM can be incorporated into imaging devices. However, with an increase in counterfeiting activity, more secure authentication and anti-counterfeit tools having a greater storage capacity are sought. Furthermore, as new technologies are developed, demand for space on circuit boards is at a premium. Therefore, a demand exists to incorporate larger amounts of memory into imaging devices, while maintaining low cost and low overall circuit board space utilization.

Examples of the present disclosure include imaging devices that include memory (e.g., non-volatile memories, memristor memories, etc.). As used herein, a memristor can include a passive two-terminal circuit element that maintains a functional relationship between the time integral of current, and the time integral of voltage. Such devices including memory can be used to implement anti-counterfeit technologies and/or to secure authentication information in the imaging devices. Examples in accordance with the present disclosure can reduce production costs (e.g., reducing per-bit-cost) related to manufacturing imaging devices while improving performance and incorporating additional features (e.g., security features) into such imaging devices. Examples of imaging devices disclosed herein can be configured to store data associated with identification information, authentication information, cloud-based printing, market data, information, customer-appreciated value (CAV) functions, and/or data.

Examples of the present disclosure provide feasible, cost-effective and highly manufacturable structures to form a printhead on a silicon area of suitable size (e.g., a relatively small area comparable to the space available on the printhead) to implement a bank of memory bits to store identification (ID) information and provide authentication. In some examples, the memristor that is formed on and/or formed integral to the printhead is provided with an ID bits line or ID line to store identification information for authentication purposes. The formed ID line can be used to store identification for authentication purposes. Further, the formed ID line can be used to receive and store security or authentication data. Such security or authentication data may be used to identify a corresponding printhead (or print cartridge) as an authentic product from a specific manufacture (e.g., an authentic brand-name print cartridge). In this manner, the ID line can be useful for manufacturers to distribute parts that are verifiable as authentic manufacturer parts. Such verifiable authenticity of parts can aid in efforts to combat counterfeiting of aftermarket parts that are often of poorer quality and can sometimes damage machines or decrease performance of machines in which the counterfeit parts are installed. In some examples, the ID line may store encryption and/or decryption data (e.g., security keys) for use in secure printing that involves, just prior to printing, decrypting data sent to a printer in an encrypted format.

Figure 1:
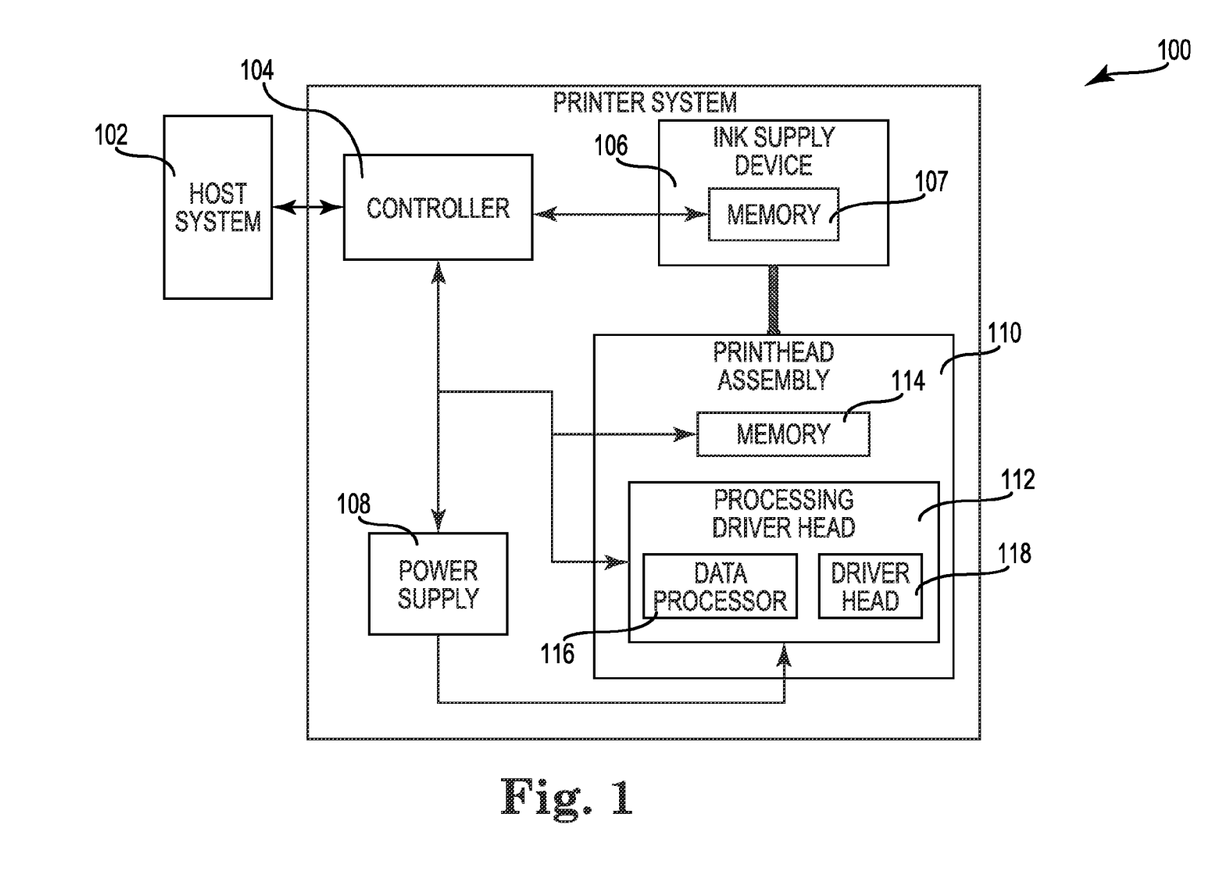
FIG. 1 illustrates a block diagram of an example of an imaging device according to the present disclosure.

FIG. 1 illustrates a block diagram of an example of an imaging device 100 according to the present disclosure. While FIG. 1 illustrates the imaging device 100 as implemented with a permanent printhead, examples are not so limited. In some examples, the imaging device 100 can include a printing apparatus having an integrated printhead (e.g., a disposable cartridge), and/or other printer or copier.

As shown in FIG. 1, the imaging device 100 can be coupled and/or otherwise in communication with a host system 102 such as a computer and/or processor. In the illustrated example, the imaging device 100 includes a controller 104, an ink supply device 106 having a memory 107, a power supply 108 and an integrated printhead assembly 110. In some examples, the printhead assembly 110 can be integrally coupled to the imaging device 100. In examples in which the printhead assembly 110 is, for example, a disposable printer cartridge, the printhead assembly 110 can be removably coupled to the printing apparatus 100.

Further, as illustrated in FIG. 1, the ink supply device 106 can be fluidly coupled to the printhead assembly 110 to enable ink to be selectively provided to the printhead assembly 110. In some examples, the printhead assembly 110 can include a processing driver head 112 and a memory (e.g., on-chip memory) 114. The example processing driver head 112 can include a data processor 116 and a driver head 118. In some examples, the memory 114 can include an identification (ID) bit line and/or ID line to store authentication and/or security data.

In some examples, the memory 114 can be implemented using a memristor integrally formed in or on the printhead assembly 110. The memristor can be integrally formed within and/or on the printhead assembly 110 using surfaces and/or structures (e.g., conductive materials) of the printhead. Thus, a portion of the memristor itself can include one or more material(s) of an otherwise functional printhead. Examples disclosed herein may be produced using a n-type metal oxide semiconductor (NMOS) process, a complementary metal oxide semiconductor (CMOS) process, a bipolar complementary metal oxide semiconductor (BiCMOS), a Bipolar-CMOS-DMOS (BDCD) process or any other process of making printheads and/or semiconductors. Examples disclosed herein may be used to manufacture an integrated circuit (IC) chip (e.g., 2.5 mm×2.5 mm size chips, 5×5 mm size chips, etc.) and/or an IC die on a printhead using an anion-based bipolar memristor based on a metal oxide system. As discussed further herein, a conductive material of the printhead can be oxidized to form the memristor structure.

Power supply 108 can provide power to the controller 104, the printhead assembly 110 and/or the processing driver head 112. In addition, the controller 104 can receive data from the host system 102. For example, the data may be authentication and/or security data to be stored in an ID line or the data may be print data. The controller 104 can process the data into printer control information and/or image data that is provided to the ink supply device 106 and/or the printhead assembly 110 to efficiently control the printing apparatus 100. During an initial programming phase, the controller 104 can store received authentication and/or security data into an ID line as part of a one time programming (OTP) process. In such examples, the authentication and/or security data can be useful for ACE features to, for example, confirm that an ink cartridge including the printhead assembly 110 is an authentic part. The authentication and/or security data may be used to implement secure printing based on data received at the printing system in an encrypted format.

The memory 107 and the memory 114 may be used to store any type of data. In some examples, the memory 107 can store ink supply specific data and/or ink identification data, ink characterization data, ink usage data, etc. However, examples are not so limited, and the memory 114 can also store printhead specific data and/or printhead identification data, warranty data, printhead characterization data, printhead usage data, authentication data, anti-counterfeiting data (ACF), etc. In a number of examples, the memory 107 and/or the memory 114 can be written to at the time of manufacturing and/or during the operation of the printing apparatus 100.

Figure 2:
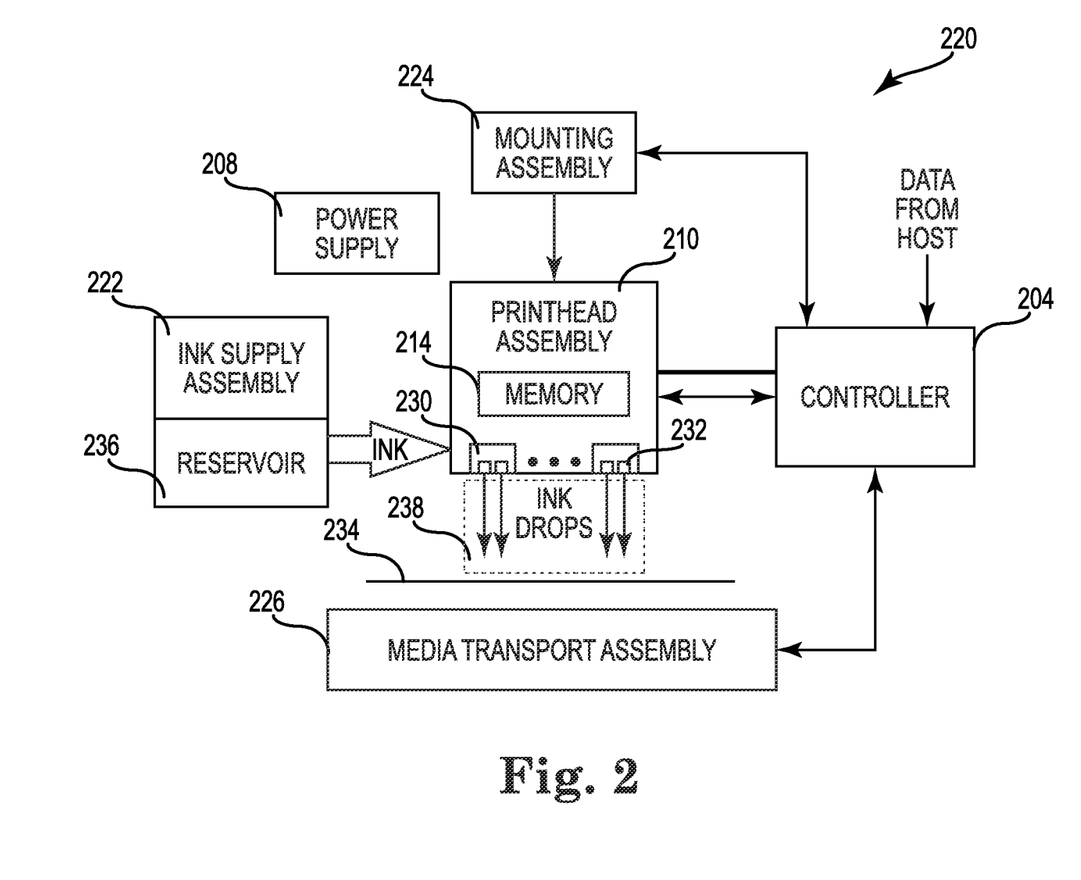
FIG. 2 illustrates an example of an inkjet printing system including an inkjet printhead assembly and an ink supply assembly according to the present disclosure.

FIG. 2 illustrates an example of an inkjet printing system 220 including an inkjet printhead assembly 210 and an ink supply assembly 222 according to the present disclosure. As illustrated in FIG. 2, the inkjet printing system 220 can include a mounting assembly 224, a media transport assembly 226, a controller 204 and power supply 208 that can provide power to the various electrical components of inkjet printing system 220.

As illustrated in FIG. 2, the inkjet printhead assembly 210 can include a memory (e.g., on-chip memory) 214, one or more printhead die(s) 230 and one or more nozzle(s) 232. The memory 214 and a printhead die 230 can be communicatively coupled to the controller 204.

In some examples, the printhead die (e.g., printhead) 230 can eject drops of ink through the nozzle 232 toward a print medium 234 so as to print onto print medium 234. The printhead 230 can include a fluid ejection device and the print media 234 can include any suitable sheet material such as, for example, paper, card stock, transparencies, Mylar, fabric, etc. In some examples, the nozzles 232 can be organized in one or more columns and/or arrays that eject ink to produce characters, symbols, graphics and/or images on the print medium 234 as the inkjet printhead assembly 210 and the print medium 234 are moved relative to one another. In a number of examples, the printhead assembly 220 may be used to eject ink, liquids, fluids, and/or flowable materials.

Ink supply assembly 222 can include a reservoir 236 for storing ink that is to be provided to the printhead assembly 210. In some examples, the ink supply assembly 222 includes a one-way ink delivery system that provides ink to the inkjet printhead assembly 210. However, examples are not so limited, and the ink supply assembly 222 can include a recirculating ink delivery system, wherein a portion (e.g., a first portion) of the ink provided to the printhead assembly 210 is consumed during printing and another portion (e.g., a second portion) of the ink provided to the printhead assembly 210 is returned to the reservoir 236 and/or the ink supply assembly 222.

In some examples, the inkjet printhead assembly 210 and the ink supply assembly 222 can be housed together in a same physical structure, such as an inkjet cartridge or pen. In other examples, the ink supply assembly 222 can be separate from the inkjet printhead assembly 210 and provide ink to the inkjet printhead assembly 210 via a coupling and/or an interface connection (e.g., a supply tube). Further, the reservoir 236 can be removed, replaced and/or refilled. In examples in which the inkjet printhead assembly 210 and the ink supply assembly 222 are housed together in an inkjet cartridge, the reservoir 236 may include a local reservoir located within the cartridge and/or a larger reservoir located outside of the cartridge. In some such examples, the larger reservoir, which may be removed, replaced and/or refilled, can be fluidly coupled to and can refill the ink supply of the smaller local reservoir.

The mounting assembly 224 can position the inkjet printhead assembly 210 relative to the media transport assembly 226, and the media transport assembly 226 can position the print medium 234 relative to the inkjet printhead assembly 210. Thus, as illustrated in FIG. 2, a print zone 238 can be defined adjacent the nozzles 232 between the inkjet printhead assembly 210 and the print medium 234.

In some examples, the inkjet printhead assembly 210 can include a scanning type printhead assembly. In such examples, the mounting assembly 224 can include a carriage that moves the inkjet printhead assembly 210 relative to the print medium 234 to enable scanning thereof. The inkjet printhead assembly 210 can include a non-scanning type printhead assembly. In such examples, the mounting assembly 224 can fix the inkjet printhead assembly 210 relative to the media transport assembly 226 and the media transport assembly 226 can position and/or move the print medium 234 relative to the inkjet printhead assembly 210.

In some examples, the controller (e.g., printer controller and/or electronic controller) 204 can include a processor and/or firmware to communicate with and/or control the inkjet printhead assembly 210, the mounting assembly 224 and the media transport assembly 226. For instance, the controller 204 can receive data from a host system. The received data can then be sent to the inkjet printing system 220 along with electronic information, infrared information, optical information and/or information transfer path information via the controller 204. In some examples, the data can be associated with a document and/or file to be printed, print job commands and/or command parameters.

Figure 3:
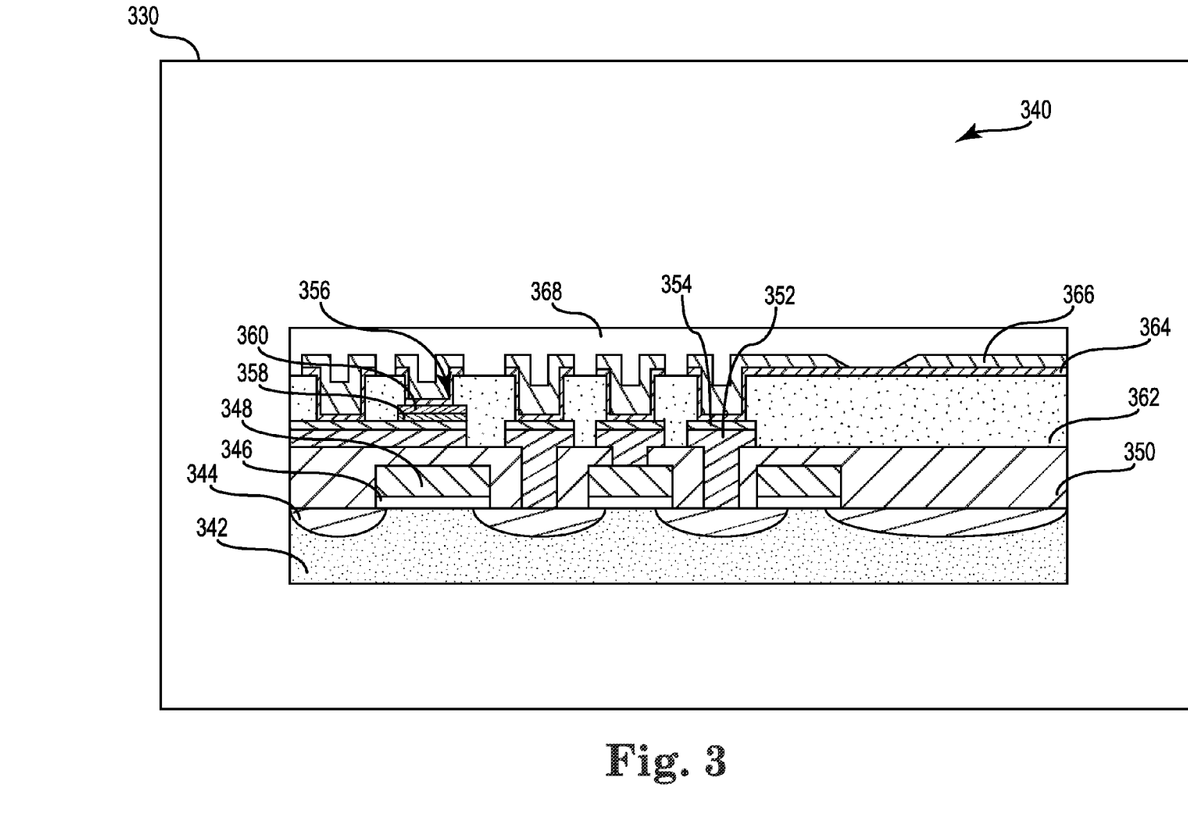
FIG. 3 illustrates an example of an integrated circuit that can be used to implement the printhead assembly and/or the memory illustrated in FIGS. 1 and 2 according to the present disclosure.

FIG. 3 illustrates an example of an integrated circuit 340 that can be used to implement the printhead assembly 110, 210 and/or the memory 114, 214 illustrated in FIGS. 1 and 2 according to the present disclosure. The integrated circuit illustrated in FIG. 3 can be implemented with NMOS based on a front end of line process (FEOL) or any other suitable process such as CMOS, BICMOS, BCD, etc. As illustrated in FIG. 3, the integrated circuit 340 can be incorporated into a printhead (e.g., printhead silicon) 330 and can include a substrate material (e.g., a first material, P-type silicon substrate and/or an N-type silicon substrate) 342 including doped regions 344 (e.g., N+ doping to decrease resistivity), a gate oxide material (e.g., a second material) 346 and an insulating material (e.g., a third material, such as polysilicon and/or other insulating materials) 348. As illustrated in FIG. 3, the gate oxide material 346 can be located between the substrate material 342 and the insulating material 348. Further, the integrated circuit 340 can include an interlayer dielectric (ILD) material (e.g., a fourth material) 350 and conductive materials (e.g., fifth and sixth materials) 352, 354. In some examples, conductive materials 352, 354 can include metal materials. However, examples are not so limited, and conductive materials 352, 354 can include other materials capable of permitting the flow of electric charges. As illustrated in FIG. 3, some portions of the ILD material 350 can be in contact with the substrate material 342, some portions of the conductive material 352 can be in contact with the substrate material 342, other portions of the conductive material 352 can be in contact with the ILD material 350, and the conductive material 354 can be in contact with the conductive material 352. In some examples, the ILD material 350 can include borophosphosilicate glass (BPSG) and/or undoped silicate glass (USG) and may be used as a metal-oxide-semiconductor field effect transistor (MOSFET) for logic and/or a power field effect transistor (PowerFET) for the integrated circuit 340. The conductive material 352 can include a metal such as an aluminum-copper alloy (e.g., aluminum copper (AlCu) or aluminum copper silicon (AlCuSi)), and the conductive material 354 can include titanium nitride (TiN), tantalum nitride (TaN), niobium nitride (NbN), hafnium nitride (HfN), zirconium nitride (ZrN), ruthenium oxide (RuO2), iridium oxide (IrO2), aluminum (Al), tantalum (Ta), titanium (Ti), copper (Cu), cobalt (Co), nitrogen (Ni), niobium (Nb), molybdenum (Mo), tungsten (W), hafnium (Hf), zirconium (Zr), chromium (Cr) or any other suitable metal. In such examples, the materials including the substrate 342 through the conductive material 352 and/or the conductive material 354 can be part of and/or can be integral to the printhead assembly 110, 210, and one and/or both of the conductive materials 352, 354 can form a bottom electrode for a memristor 356. For instance, the structure of the substrate material 342 through the conductive material 354, may be integral structures and/or materials of a printhead used for printing functionality. In a number of examples, a memristor may be formed on the conductive material 352 and/or the conductive material 354 of the printhead.

In some examples, the integrated circuit 340 can include a memristor switching oxide material (e.g., a seventh material) 358 and a memristor top electrode material (e.g., an eighth material) 360. In some examples, the memristor top electrode material 360 can include a conductive material, such as a metal. However, examples are not so limited, and the memristor top electrode material 360 can include other materials capable of permitting the flow of electric charges. In some examples, the memristor switching oxide material 358 can be formed by oxidizing one or more of the conductive materials 352, 354. Additionally, as illustrated in FIG. 3, the integrated circuit 340 can include a dielectric material (e.g., a ninth material) 362, a conductive material (e.g., a tenth material) 364, a thermal inkjet resistor material (e.g., an eleventh material and/or conductive material) 366 and/or a passivation material (e.g., a twelfth material) 368. In some examples, the thermal inkjet resistor material 366 can include tantalum aluminum (TaAl), tantalum aluminum oxide (TaAlOx), tungsten silicon nitride (WSiN), tantalum silicon nitride (TaSiN) and/or an aluminum-copper alloy.

For ease of description, the nomenclature of first, second, third, etc. are used to facilitate in distinguishing between the materials 342, 344, 346, etc. of the integrated circuit 340. However, such first, second, third, etc. naming convention is not intended to signify any priority, importance or inherent physical positioning of the materials relative to one another. That is, first, second, third, etc. terms may be arbitrarily applied to any material to ease in identifying between different materials.

FIGS. 4-16 illustrate examples of stages in a process of producing the example integrated circuit 340 of FIG. 3. In some examples, the process described below of incorporating memristor memories into an on-chip printhead can occur when fabricating the integrated circuit 340 of FIG. 3. While FIGS. 4-16 depict a particular number of materials being formed and particular material(s) being formed in a particular order, the order in which any one or more of the materials are formed may be changed and/or the number of materials formed may be changed (e.g., increased, decreased, etc.).

Figure 4:
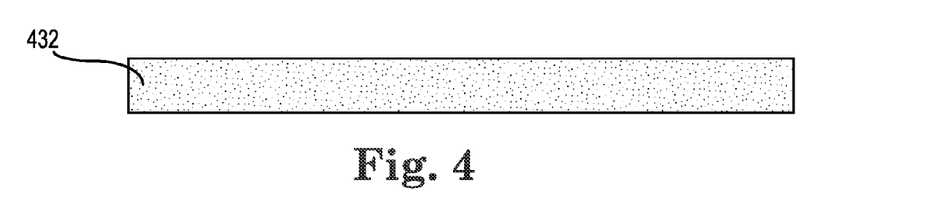
FIG. 4 illustrates an example of a stage in a process of producing the integrated circuit illustrated in FIG. 3 according to the present disclosure.
Figure 5:
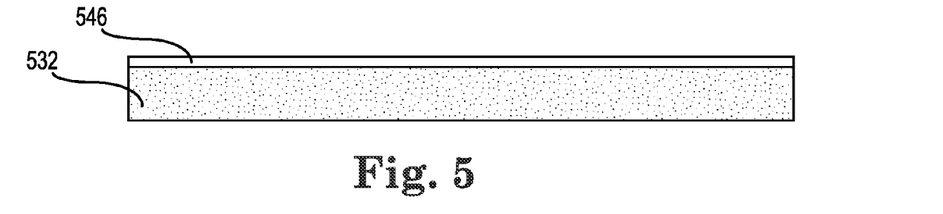
FIG. 5 illustrates an example of a stage, subsequent to the stage illustrated in FIG. 4, of the process of producing the integrated circuit illustrated in FIG. 3 according to the present disclosure.
Figure 6:
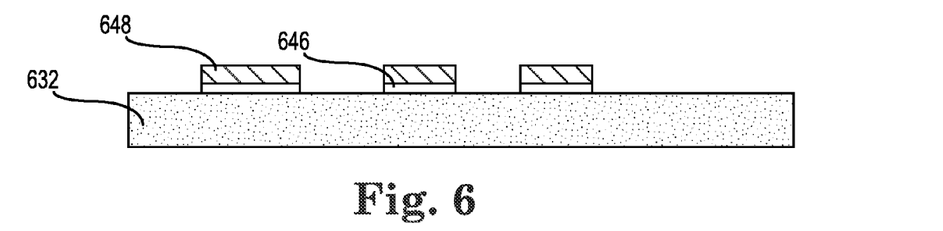
FIG. 6 illustrates an example of a stage, subsequent to the stage illustrated in FIG. 5, of the process of producing the integrated circuit illustrated in FIG. 3 according to the present disclosure.

FIG. 4 illustrates an example of a stage in a process of producing the integrated circuit 340 illustrated in FIG. 3 according to the present disclosure. As illustrated in FIG. 4, the process beings with a substrate material 432. FIG. 5 illustrates an example of a stage, subsequent to the stage illustrated in FIG. 4, of the process of producing the integrated circuit 340 illustrated in FIG. 3. As illustrated in FIG. 5, a gate oxide material 546 can be deposited on the substrate material 532. FIG. 6 illustrates an example of a stage, subsequent to the stage illustrated in FIG. 5, of the process of producing the integrated circuit 340 illustrated in FIG. 3. As illustrated in FIG. 6, an insulating material 648, can be deposited and patterned (e.g., etched away) above the substrate material 632 and gate oxide material 646. For example, a portion of the materials 646, 648 can be patterned and/or etched away, to remove portions of the gate oxide material 646, and the insulating material 648. In some examples, there is no field oxide (FOX) isolation, shallow trench isolation (STI) or deep trench isolation (DTI). In some examples, transition isolation is done through a looped transistor design. For instance, the gate oxide material 646 can be formed on the substrate material 632, and the insulating material 648 can be formed on the gate oxide material 646, as illustrated in FIG. 6.

Figure 7:
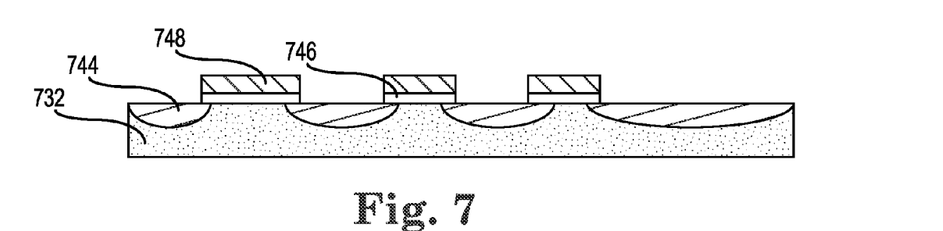
FIG. 7 illustrates an example of a stage, subsequent to the stage illustrated in FIG. 6, of the process of producing the integrated circuit illustrated in FIG. 3 according to the present disclosure.

FIG. 7 illustrates an example of a stage, subsequent to the stage illustrated in FIG. 6, of the process of producing the integrated circuit 340 illustrated in FIG. 3 according to the present disclosure. As illustrated in FIG. 7, an in-situ doping and/or implanting process can be used to provide the first material 732 with the conductive doped regions 744 (e.g., a doping of N+ to create a very low resistivity in a range). In the illustrated example, the conductive doped regions 744 can provide electrically conductive pathways for electrons to flow between, for example, separate structures of the gate oxide material 746. In some examples, spacers (not illustrated) can be deposited adjacent to conductive doped regions 744 and gate oxide material 746. Further, lightly doped drains (not illustrated) can be deposited adjacent to the conductive doped regions 744.

Figure 8:
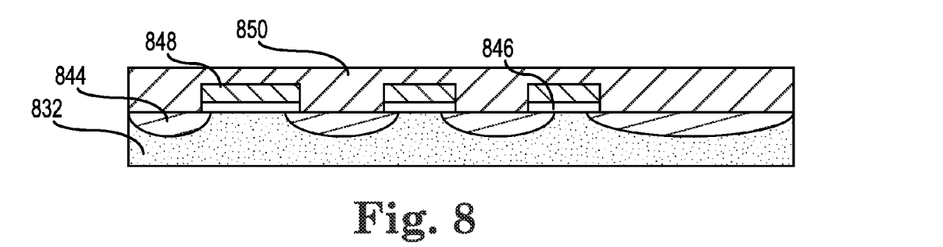
FIG. 8 illustrates an example of a stage, subsequent to the stage illustrated in FIG. 7, of the process of producing the integrated circuit illustrated in FIG. 3 according to the present disclosure.
Figure 9:
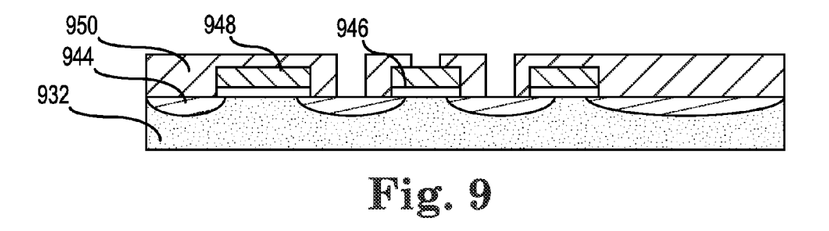
FIG. 9 illustrates an example of a stage, subsequent to the stage illustrated in FIG. 8, of the process of producing the integrated circuit illustrated in FIG. 3 according to the present disclosure.

FIG. 8 illustrates an example of a stage, subsequent to the stage illustrated in FIG. 7, of the process of producing the integrated circuit 340 illustrated in FIG. 3 according to the present disclosure. As illustrated in FIG. 8, the ILD material 850 can be formed and/or deposited on the substrate material 832. FIG. 9 illustrates an example of a stage, subsequent to the stage illustrated in FIG. 8, of the process of producing the integrated circuit 340 illustrated in FIG. 3. As illustrated in FIG. 9, the patterned structures of the gate oxide material 946 and the insulating material 948 can be formed. The ILD material 950 can be contact patterned and/or etched away using, for example, a photo lithography process to form the patterned structures of the ILD material 950 as illustrated in FIG. 9.

Figure 10:
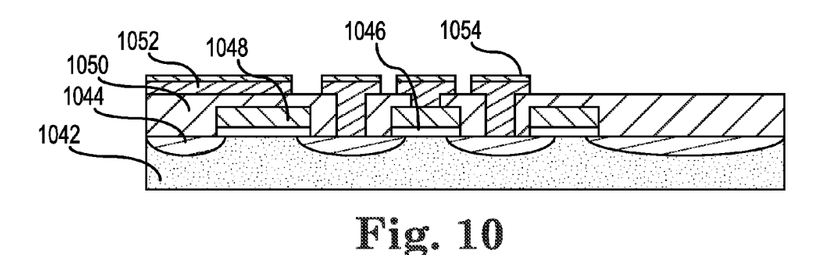
FIG. 10 illustrates an example of a stage, subsequent to the stage illustrated in FIG. 9, of the process of producing the integrated circuit illustrated in FIG. 3 according to the present disclosure.

FIG. 10 illustrates an example of a stage, subsequent to the stage illustrated in FIG. 9, of the process of producing the integrated circuit 340 illustrated in FIG. 3 according to the present disclosure. As illustrated in FIG. 10, the conductive materials 1052, 1054 can be deposited on the ILD material 1050 and the substrate material 1042. In some examples, the conductive material 1054 can be formed of TiN TaN, NbN, HfN, ZrN, RuO2, IrO2, Al, Ta, Ti, Cu, Co, Ni, Nb, Mo, W, Hf, Zr, and/or Cr. Also, in some examples, AlCuSi can be used as a bottom electrode for the memristor 356 (illustrated in FIG. 3).

Figure 11:
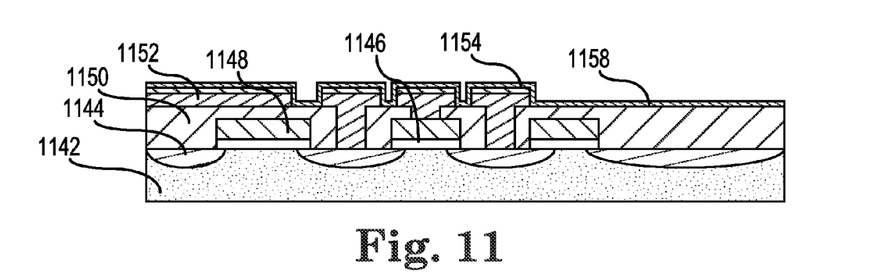
FIG. 11 illustrates an example of a stage, subsequent to the stage illustrated in FIG. 10, of the process of producing the integrated circuit illustrated in FIG. 3 according to the present disclosure.

FIG. 11 illustrates an example of a stage, subsequent to the stage illustrated in FIG. 10, of the process of producing the integrated circuit 340 illustrated in FIG. 3 according to the present disclosure. As illustrated in FIG. 11, the memristor switching oxide material 1158 can be formed (e.g., grown) using the conductive material 1154 and/or the conductive material 1152. For example, the memristor switching oxide material 1158 can be formed by performing thermal oxidation, and exposing materials 1152 and/or 1154 to oxidizing agents (e.g., air, $O_2$, $H_2O$, $CO_2$, etc.) at elevated temperatures (e.g., 100-400° C. or higher). However, examples are not so limited, and thermal oxidation may be performed on conductive material 1154 and/or conductive material 1152 using a furnace oxidation process. Similarly, thermal oxidation may be performed on conductive material 1154 and/or conductive material 1152 using a rapid thermal processing (RTP) method, including rapid thermal oxidation (RTO) and/or rapid thermal annealing (RTA).

In some examples, memristor switching oxide material 1158 can be formed by performing plasma oxidation, and exposing materials 1152 and/or 1154 to oxygen plasma at ambient and/or elevated temperatures. Also, memristor switching oxide material 1158 can be formed by performing ozone oxidation, and exposing materials 1152 and/or 1154 to ozone at ambient and/or elevated temperatures. However, examples are not so limited, and other oxidation processes can be used to oxidize conductive material 1152 and/or conductive material 1154 (e.g., exposing conductive materials 1152 and/or 1154 to oxidizing liquids such as $H_2O_2$). In some examples, the memristor switching oxide material 1158 can be TiOx or TaOx and can have a thickness of between about, for example, a few nanometers to a dozen nanometers. However, examples are not so limited, and the memristor switching oxide material 1158 can include a quaternary oxide. For instance, the memristor switching oxide material 1158 can include TaAlCuOx. In another example, the memristor switching oxide material 1158 can include AlOxSiOyCuOz or other complex oxide.

In some examples, oxidation of conductive material 1152 and/or conductive material 1154 can be dominated by the oxidation of one or two alloying compounds (e.g., preferential and/or selective oxidation). Further, the memristor switching oxide material 1158 can include less elements than the number of alloying compounds. For example, conductive material 1152 and/or conductive material 1154 can include TaAlCu, and oxidation of TaAlCu (e.g., a ternary alloy) can form memristor switching oxide material 1158 comprising a binary oxide (e.g., an oxide having two elements, one of which is oxygen), a ternary oxide (e.g., an oxide having three elements, one of which is oxygen), or a quaternary oxide (e.g., an oxide having four elements, one of which is oxygen).

Figure 12:
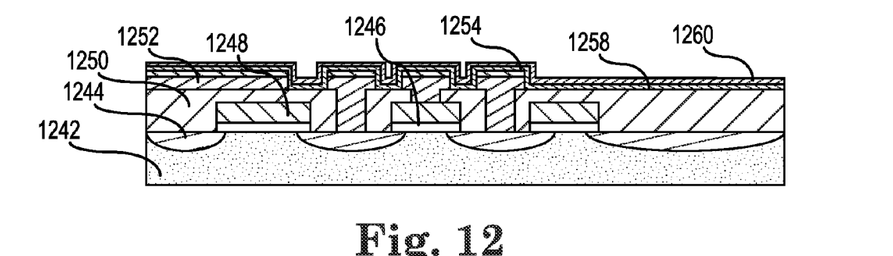
FIG. 12 illustrates an example of a stage, subsequent to the stage illustrated in FIG. 11, of the process of producing the integrated circuit illustrated in FIG. 3 according to the present disclosure.
Figure 13:
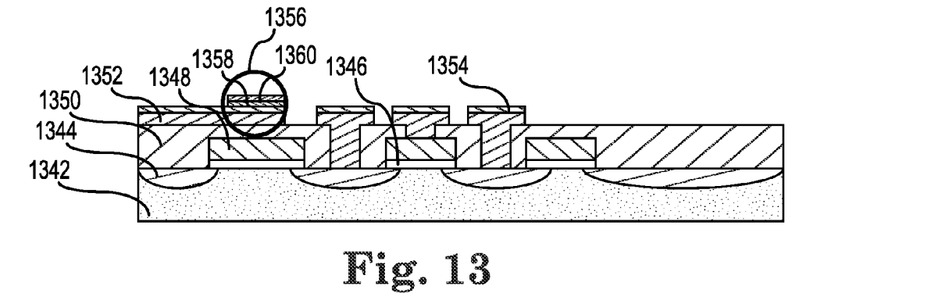
FIG. 13 illustrates an example of a stage, subsequent to the stage illustrated in FIG. 12, of the process of producing the integrated circuit illustrated in FIG. 3 according to the present disclosure.

FIG. 12 illustrates an example of a stage, subsequent to the stage illustrated in FIG. 11, of the process of producing the integrated circuit 340 illustrated in FIG. 3 according to the present disclosure. As illustrated in FIG. 12, a memristor top electrode 1260 can be deposited on the memristor switching oxide material 1258. In some examples, the memristor top electrode 1260 can be formed using Ta and/or TaAl. Further, FIG. 13 illustrates an example of a stage, subsequent to the stage illustrated in FIG. 12. As illustrated in FIG. 13, the memristor switching oxide material 1358 and/or the memristor top electrode material 1360 can be patterned and/or etched using a photo lithography process.

Figure 14:
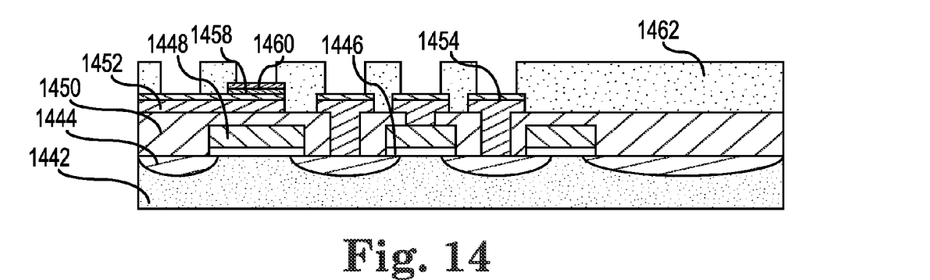
FIG. 14 illustrates an example of a stage, subsequent to the stage illustrated in FIG. 13, of the process of producing the integrated circuit illustrated in FIG. 3 according to the present disclosure.
Figure 15:
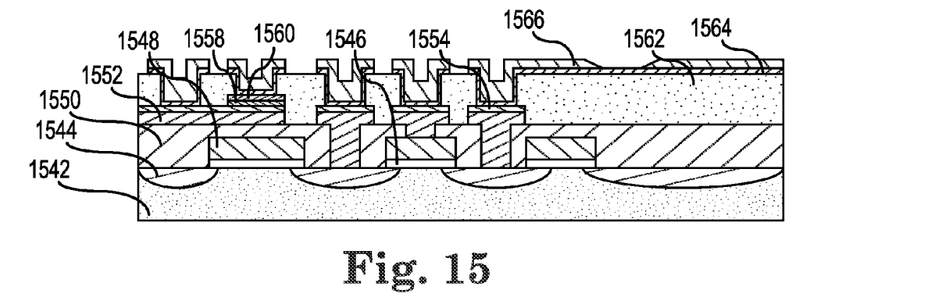
FIG. 15 illustrates an example of a stage, subsequent to the stage illustrated in FIG. 14, of the process of producing the integrated circuit illustrated in FIG. 3 according to the present disclosure.

FIG. 14 illustrates an example of a stage, subsequent to the stage illustrated in FIG. 13, of the process of producing the integrated circuit 340 illustrated in FIG. 3 according to the present disclosure. As illustrated in FIG. 14, the dielectric material 1462 can be deposited, patterned and/or etched on the ILD material 1450, the conductive material 1452, the conductive material 1454, and the memristor top electrode material 1460. Further, FIG. 15 illustrates an example of a stage, subsequent to the stage illustrated in FIG. 14. As illustrated in FIG. 15, the conductive material 1564 can be formed on the dielectric material 1562, the conductive material 1554 and the memristor top electrode material 1560. As illustrated in FIG. 15, the conductive material 1564 and the thermal inkjet resistor material 1566 can be patterned and/or etched to form bond pad openings.

Figure 16:
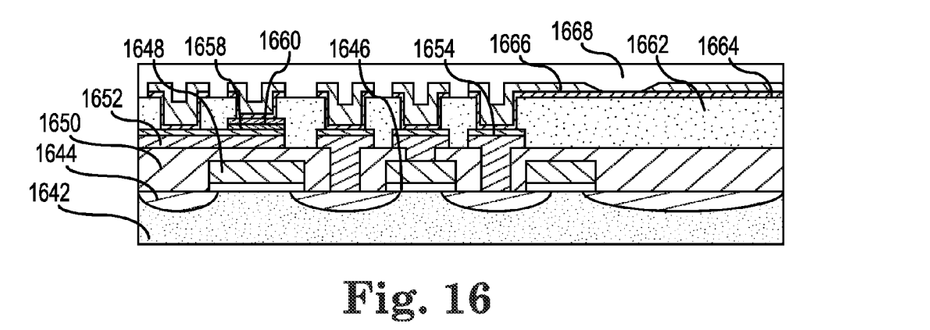
FIG. 16 illustrates an example of a stage, subsequent to the stage illustrated in FIG. 15, of the process of producing the integrated circuit illustrated in FIG. 3 according to the present disclosure.

FIG. 16 illustrates an example of a stage, subsequent to the stage illustrated in FIG. 15, of the process of producing the integrated circuit 340 illustrated in FIG. 3 according to the present disclosure. As illustrated in FIG. 16, the thermal inkjet resistor material 1666 can be formed on the conductive material 1664. In some examples, the thermal inkjet resistor material 1666 can include a dual material including a high sheet resistive material (e.g., TaAl, TaAlOx, WSiN, TaSiN) and a lower resistive material (e.g., AlCu). Further, to protect against corrosion, the passivation material 1668 illustrated in FIG. 15 can be formed on the dielectric material 1662, the conductive material 1664 and the thermal inkjet resistor material 1666.

Figure 17:
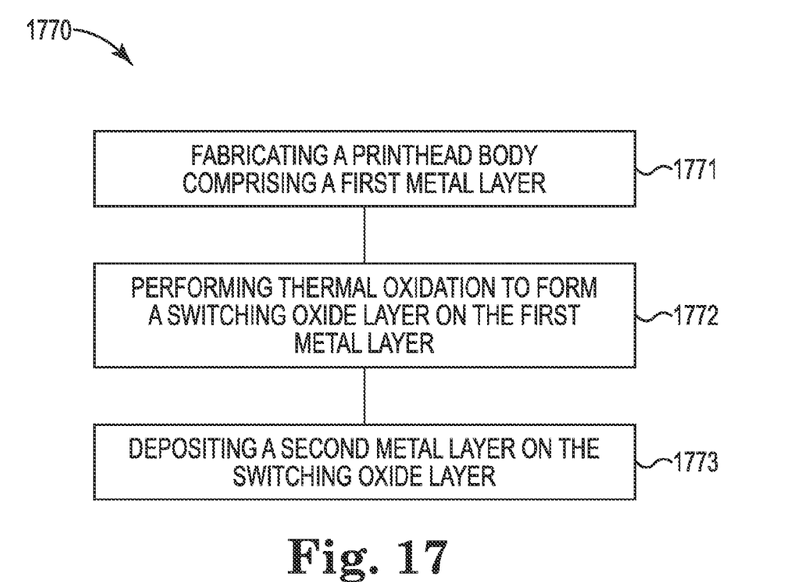
FIG. 17 illustrates a flowchart of an example of a method for oxidizing memristors on imaging devices according to the present disclosure.

FIG. 17 illustrates a flowchart of an example method 1770 for oxidizing memristors on imaging devices according to the present disclosure. At 1771, the method 1770 can include fabricating a printhead body comprising a first conductive material. For instance, the first conductive material can include materials 352 and/or 354 as illustrated in FIG. 3.

At 1772, the method 1770 can include integrally forming a memory with the printhead body by performing thermal oxidation to form a switching oxide material on the first conductive material. For instance, performing thermal oxidation to form the switching oxide material can include performing a furnace oxidation process, as described in relation to FIGS. 4-16. In some examples, performing thermal oxidation can include performing a rapid thermal processing method. Additionally, in some examples, integrally forming the memory can include etching the oxide material, the switching oxide material, and the second conductive material, as described in relation to FIGS. 4-16.

At 1773, the method 1770 can include depositing a second conductive material on the switching oxide material, wherein the first conductive material comprises a first electrode of the memory and the second conductive material comprises a second electrode of the memory.

In the present disclosure, reference is made to the accompanying drawings that form a part hereof, and in which is shown by way of illustration how a number of examples of the disclosure can be practiced. These examples are described in sufficient detail to enable those of ordinary skill in the art to practice the examples of this disclosure, and it is to be understood that other examples can be used and that process, electrical, and/or structural changes can be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. As used herein, "a" or "a number of" something can refer to one or more such things. For example, "a number of widgets" can refer to one or more widgets.

The above specification, examples and data provide a description of the method and applications, and use of the system and method of the present disclosure. Since many examples can be made without departing from the spirit and scope of the system and method of the present disclosure, this specification merely sets forth some of the many possible embodiment configurations and implementations.

What is claimed is:

1. A method of forming a printhead with a memristor, comprising:
   forming a printhead body comprising a first conductive material;
   forming a third conductive material on the first conductive material;
   forming a memory with the printhead body by:
      forming a switching oxide material on the first conductive material via thermal oxidation of the first conductive material and the third conductive material; and
      forming a second conductive material on the switching oxide material, wherein the first and the third conductive materials comprise a first electrode of the memory and the second conductive material comprises a second electrode of the memory.

2. The method of claim 1, wherein the thermal oxidation includes performing a furnace oxidation process.

3. The method of claim 1, wherein the thermal oxidation includes performing a rapid thermal processing method.

4. The method of claim 1, wherein forming the memory comprises etching the switching oxide material and the second conductive material.

5. The method of claim 1, further comprising implementing, via the memory, a bank of memory bits to store identification information and provide authentication.

6. A method of forming a printhead with a memristor, comprising:
   forming a printhead body by depositing a first conductive material on a number of materials and a third conductive material on the first conductive material; and
   forming a memory on the printhead body, wherein the memory includes the first conductive material and the third conductive material as a first electrode, a second conductive material as a second electrode, and a switching oxide material formed by plasma oxidation of the first conductive material and the third conductive material, between the first and second conductive materials.

7. The method of claim 6, wherein forming the printhead body further includes depositing a doped substrate material, a gate oxide material, and a polysilicon material, and wherein the gate oxide material is deposited between the doped substrate material and the polysilicon material.

8. The method of claim 7, wherein forming the printhead body further includes depositing a dielectric material between the doped substrate material and the first conductive material.

9. The method of claim 8, wherein forming the printhead body further includes depositing a fourth conductive material, and wherein the dielectric material is deposited between the doped substrate material and the fourth conductive material.

10. The method of claim 9, wherein the switching oxide material includes a ternary oxide.

11. A method of forming a printhead with a memristor, comprising:
- depositing a gated oxide material on a number of materials and etching away portions of the gated oxide material and the number of materials;
- performing a doping process to provide conductive doped regions adjacent to the etched gated oxide material;
- depositing a first conductive material on the gated oxide material and the number of materials and a third conductive material on the first conductive material; and
- forming a memristor on the first conductive material and the third conductive material, by performing ozone oxidation on the first and the third conductive material to form a switching oxide material, and depositing a second conductive material on the switching oxide material,
    - wherein the first and the third conductive materials are a bottom electrode of the memristor and the second conductive material is a top electrode of the memristor.

12. The method of claim 11, further comprising depositing lightly doped drains adjacent to the conductive doped regions.

13. The method of claim 11, wherein the switching oxide material includes a quaternary oxide.

14. The method of claim 13, wherein the quaternary oxide includes a tantalum aluminum copper oxide.

15. The method of claim 11, wherein the switching oxide material includes a binary oxide.

* * * * *